United States Patent [19]

Ohtaka

[11] Patent Number: 5,029,249
[45] Date of Patent: Jul. 2, 1991

[54] ELECTRON MICROSCOPE

[75] Inventor: Tadashi Ohtaka, Katsuta, Japan

[73] Assignee: Hitachi, Ltd., Tokyo, Japan

[21] Appl. No.: 381,191

[22] Filed: Jul. 18, 1989

[30] Foreign Application Priority Data

Jul. 22, 1988 [JP] Japan .............................. 63-182991

[51] Int. Cl.⁵ .............................................. G21K 1/08
[52] U.S. Cl. .................................... 250/306; 250/307; 250/310; 250/396 R; 250/396 ML
[58] Field of Search ............ 250/306, 396 ML, 441.1, 250/311, 310, 396 R, 440.1

[56] References Cited

U.S. PATENT DOCUMENTS

| | | | |
|---|---|---|---|
| 3,346,736 | 10/1967 | Neuhaus | 250/306 |
| 3,535,515 | 10/1970 | Jones et al. | 250/310 |
| 3,560,739 | 2/1971 | Wolff | 250/306 |
| 3,916,201 | 10/1975 | Herrmann et al. | 250/311 |
| 4,691,103 | 9/1982 | Le Poole et al. | 250/311 |
| 4,694,171 | 9/1987 | Hosoi et al. | 250/311 |
| 4,803,369 | 2/1989 | Otaka | 250/310 |
| 4,806,766 | 2/1989 | Chisholm | 250/311 |
| 4,812,652 | 3/1989 | Egle et al. | 250/396 ML |
| 4,814,615 | 3/1989 | Fushimi et al. | 250/307 |
| 4,823,006 | 4/1989 | Panilatos et al. | 250/441.1 |

Primary Examiner—Jack I. Berman
Assistant Examiner—Kiet T. Nguyen
Attorney, Agent, or Firm—Antonelli, Terry, Stout & Kraus

[57] ABSTRACT

An electron microscope eliminates external ducting for evacuation by interlinking the interiors of a sample chamber for a sample, a casing for electron lenses and a chamber for an electron gun. Those interiors form a closed space with an evacuation path extending therethrough and are evacuated by evacuation means a vacuum pump connected to the sample chamber. The electron lenses are contained within sealed modules and the evacuation path passes between the sides of those modules and the internal walls of the casing. The resulting structure may be enclosed in substantially unbroken magnetic shielding.

16 Claims, 3 Drawing Sheets

ELECTRON MICROSCOPE

BACKGROUND OF THE INVENTION

1. Field of the Invention

The present invention relates to an electron microscope e.g., a scanning electron microscope or a transmission electron microscope.

2. Summary of the Prior Art

An electron microscope normally comprises a specimen chamber in which the specimen to be analysed is located, and an electron column which generates a beam of electrons which are used to bombard the specimen. That electron column itself normally has two parts, an electron gun chamber containing an electron gun for generating the beam of electrons, and a casing containing an electron lens arrangement. That electron lens arrangement usually includes a plurality of condenser lenses arranged vertically inside the casing with the electron beam passing down a central axis of those condenser lenses. Alignment coils for aligning the electrons into a narrow beam are located between the condenser and the electron gun. Finally, in e.g, a scanning electron microscope, scanning coils (deflection coils) are located between the condenser lenses and the sample, which cause the beam to scan across that sample. Thus, an electron beam path is defined between the electron gun and the sample, passing through the lenses and coils.

It is important that electrons following that path are not scattered, and for this reason the interior of the electron column has to be evacuated to a low pressure. The sample chamber must also be evacuated. The standard method of evacuating the interior of the electron column is to connect that column to a vacuum pump via a plurality of ducts which extend from the vacuum pump through the walls of the electron column. Example of such an arrangement is shown in Japanese patent application laid-open number 49-131376, in which there are three ducts extending from the electron column and one from the sample chamber which are interconnected at a diffusion pump. Similarly, in Japanese patent application laid-open number 55-136446, there are again a plurality of ducts leading from the electron column.

However, the presence of such ducts causes a number of problems. The first problem is that, if a good vacuum is to be achieved within the electron column, it is necessary that the ducts be relatively large, so that they have satisfactory conductance. The size of the ducts is inconvenient, and limits the positioning of additional devices which may be heeded around the electron column, such as an X-ray system.

A further problem associated with the presence of the ducts to the vacuum pump is that their presence means that apertures must be made in any magnetic shielding around the electron column. Stray magnetic fields may cause magnetic disturbance, and if this is allowed to affect the electron beam, the accuracy of the operation of the microscope may be compromised. For example, a magnetic disturbance due to e.g. noise may cause a ripple on the image produced by the electron microscope, thereby blurring that image. Therefore, in order to limit magnetic disturbance. it is known to place a shielding cylinder around the electron column, but it is necessary that apertures be made in that shielding to permit the ducting to the vacuum pump to emerge. Bearing in mind that that ducting needs to be large in order to achieve a good vacuum, there is thus a conflict between the need for a good vacuum and the need for good magnetic shielding.

SUMMARY OF THE INVENTION

The present invention therefore seeks to overcome, or at least ameliorate, these problems.

The present invention proposes that the ducting to the electron column which has been used in the prior art be dispensed with, and that the evacuation path of the electron gun chamber and/or casing containing the electron lens assembly, be defined within the casing itself. At first sight, the beam path may be thought of as a suitable route for that evacuation path, but in fact that beam path will normally include a plurality of restricted apertures whose purpose is to collimate the beam, and therefore those small apertures would restrict the conductance of any evacuation path running along the beam path.

Therefore, in the present invention, that evacuation path is off-axis relative to the beam.

In the present invention, the casing containing the electron lens assembly may be made from a closed enclosure, together with the electron gun chamber and the sample chamber. Then, by connecting suitable evacuation means in the form of e.g., a vacuum pump to the sample chamber, the whole interior can be evacuated.

Furthermore, since the ducting outside the electron column is dispensed with, it becomes possible for the magnetic shielding to be unbroken, except possibly where the electron microscope has an adjustable aperture (which is normally positioned between the condenser lenses and the deflection coils) since the control for that adjustable aperture has to project through the magnetic shielding. The magnetic shielding may simply extend along the casing, and be sealed to the outside of the sample chamber, but preferably there is a further shielding part which encloses the electron gun chamber.

Of course, if the evacuation path is defined within the casing, its size needs to be sufficiently large to permit a high conductance. However, in practice it is found that suitable apertures between the electron gun chamber and the casing, adjacent the condenser lenses, and between the casing and the sample chamber permit a sufficiently high conductance to be achieved. Indeed, it is possible with the present invention to achieve a higher conductance than was normally achieved in standard arrangements using external ducting.

Japanese patent application laid-open number 59-209045 apparently shows an arrangement in which there is no external ducting. However, the device shown in that disclosure is an electron analysing apparatus which involves the detection of Auger electrons, and therefore must operate under extremely high vacuum, much higher than is normally used in electron microscopes such as scanning electron microscopes or transmission electron microscopes. Therefore, one skilled in the art reading Japanese patent application laid-open number 59-209045 will immediately appreciate that what is illustrated is wholly schematic, and that additional ducting would be necessary in order to achieve the desired level of vacuum. Indeed, this can be seen from the fact that the arrangement is illustrated with the condenser lenses apparently directly contacting the vacuum, which would result in contamination and would not operate satisfactorily.

In the present invention, the electron lenses should be sealed from the vacuum. To do this, a development of the present invention proposes that those electron lenses be mounted in sealed modules, and a plurality of such modules be positioned within the casing of the electron. A bore extends through the centre of those modules, to define the electron beam path, but by suitable design of the modules, the evacuation path may be between the outer wall of those modules and the inner wall of the casing.

If the electron lens assembly is formed in this way, forming a plurality of modules, the modules may be spaced by suitable spacers. It is desirable that those spacers have apertures therein so that they may thus form part of the evacuation path.

If the evacuation path extends around the condenser lenses in the way described above, then the main limit on conductance from the electron gun chamber to the specimen chamber is at the mounting of the electron gun chamber to the casing, and the mounting of the casing to the specimen chamber. At these points, a plurality of apertures are usually necessary, and, particularly between the electron gun chamber and the casing, this may be achieved by providing a tie member in the form of a plate with a plurality of apertures therein.

BRIEF DESCRIPTION OF THE DRAWINGS

An embodiment of the invention will now be described in detail, by way of example, with reference to the accompanying drawings in which.

DETAILED DESCRIPTION

Figure 1:
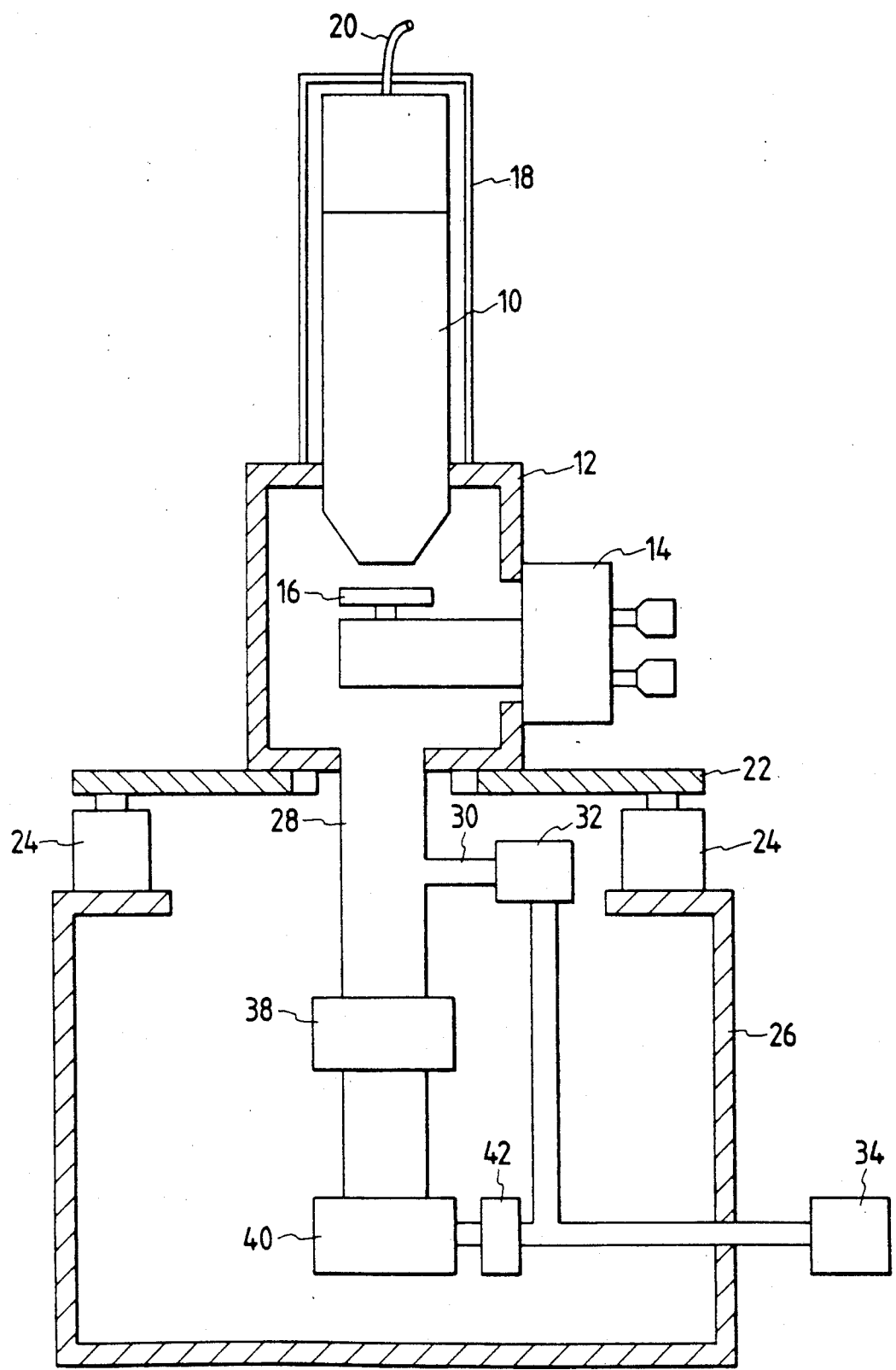
FIG. 1 shows a schematic sectional view through a scanning electron microscope being an embodiment of the present invention.

Referring first to FIG. 1, a scanning electron microscope comprises an electron column 10 (which will be described in more detail later) mounted on a specimen chamber 12. That specimen chamber is hollow, and a specimen support 14 extends into that hollow specimen chamber 12 for supporting a specimen 16 below the electron column. FIG. 1 also shows an enclosure 18 for magnetic shielding, from which extends a power cable 20 for powering the electron gun of the electron column. The specimen chamber is mounted on a stage 22 which is supported via damping supports 24 on a frame 26.

FIG. 1 also illustrates the vacuum system for evacuating the specimen chamber 12. The duct 28 extends from that specimen chamber 12 and a first branch 30 extends via a valve 32 to a diffusion pump 40 which is itself connected via a valve 42 to the rotary pump 34. To evacuate the sample chamber, valves 38 and 42 are first closed, and the rotary pump operated to reduce the pressure within the specimen chamber 12. However, the rotary pump cannot achieve the necessary level of vacuum, and therefore when the pressure has fallen to a suitable level, the valve 32 is closed and the valves 38 and 42 are opened. Then, the diffusion pump 40 continues the evacuation of the specimen chamber 12 until a suitable vacuum has been achieved.

Other vacuum systems may be used, however, such as e.g., a turbo-molecular pump.

Figure 2:
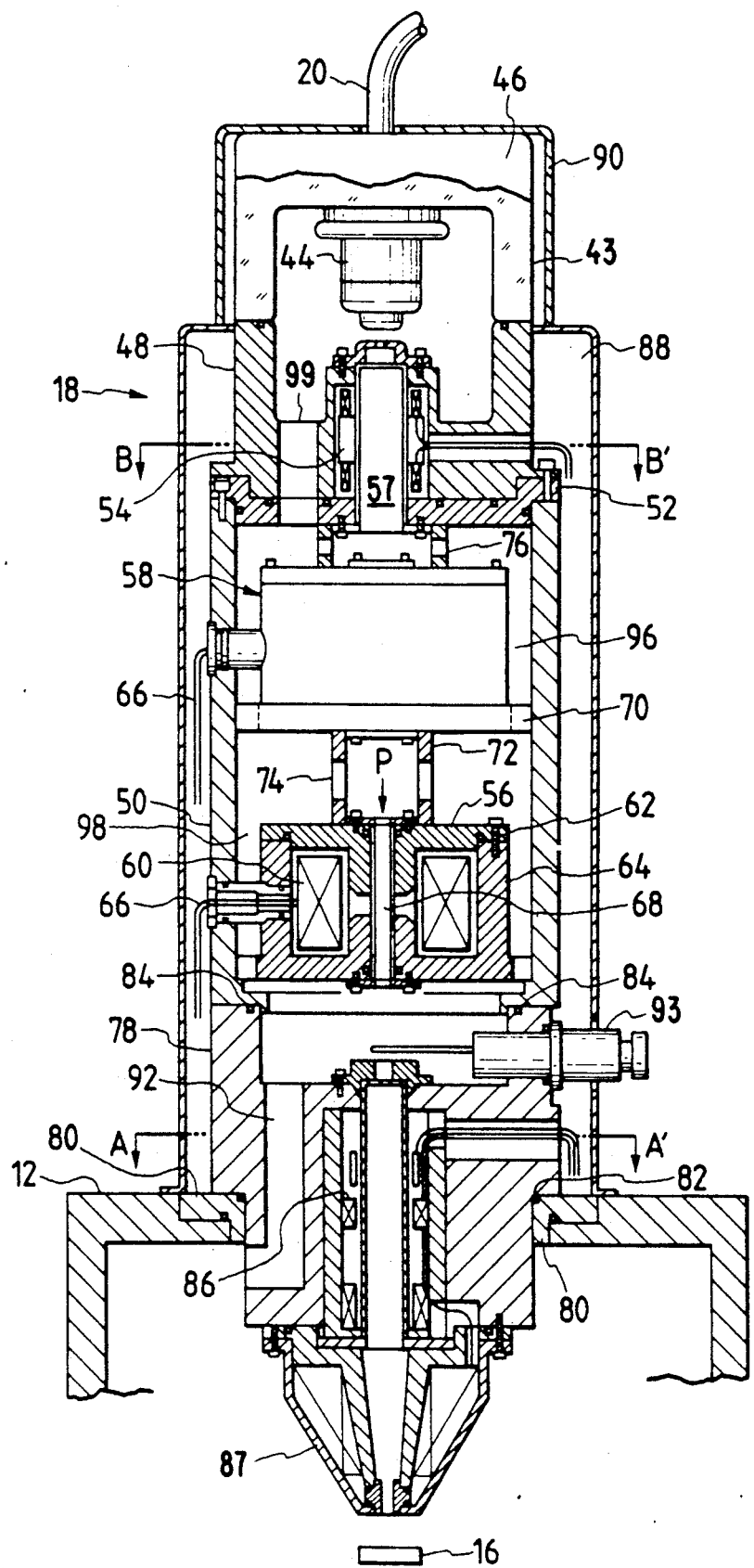
FIG. 2 shows, in sectional view, the structure of the electron column used in the electron microscope of FIG. 1.

Referring now to FIG. 2 which shows the structure of the electron column in more detail, it can be seen that that column comprises a plurality of parts. Firstly, at the top of the column is an electron gun chamber 43 containing an electron gun 44 which generates a beam of electrons. As illustrated, the electron gun chamber comprises an upper part 46 and a lower part 48 sealed together, the lower part being connected to a casing 50 for electron lenses via a spacer plate 52. Also illustrated is the alignment coil assembly 54 which, as can be seen, has a bore 57 therein which forms part of the path of the electron beam. Although not illustrated, that bore 57 will normally contain a lining having only a small aperture therein to collimate the beam. It should be noted, that in order to prevent contamination, the alignment coil assembly 54 is hermetically sealed from the interior of the electron gun chamber 42 and the interior of the casing 50.

The casing 50 contains a plurality of modules 56, 58 containing condenser electron lenses. FIG. 2 shows two such modules 56, 58, but more may be provided if necessary.

Module 56 is shown in sectional view, and it can be seen there that the coils 60 of the lens are encased within magnetic shielding material formed by two shielding parts 62, 64. Power cables 66 extend from each module out of the casing 50 and are connected to a suitable power supply. Bores 68 extend down the centre of the modules to form the electron beam path, and these bores 68 may contain collimating apertures.

The modules 56, 58 are not sealed to the walls of the casing 50, but may be simply be fitted therein provided that a close tolerance is achieved. It can be seen in FIG. 2 that each module has a flange 70 thereon which fits against the wall of the casing, with the rest of the module 56, 58 being of smaller diameter than the interior of the casing 50. The modules 56, 58 themselves are separated by a spacer 72, having openings 74 therein, and a further spacer 76 may be provided again having holes therein, between the upper module 58, and the spacer plate 52.

The casing 50 is connected via a tie block 78 to the specimen chamber 12. A spacer 80 of non-magnetic material may be provided between that tie block 78 and the specimen chamber 12, with rings 82, 84 sealing the tie block 78 to the spacer 80 and the casing 50 respectively. Within the tie block 78 is a deflection coil unit 86, again having a bore therein to define the electron beam path, and attached to the bottom of the tie block 78 is an objective lens assembly 87.

The resulting assembly is enclosed within the enclosure 18 for magnetic shielding, which enclosure comprises a lower shielding member 88 and an upper shielding member 90. The lower shielding member 88 is sealed to the outside of the specimen chamber 12, and extends to cover the tie block 78, the casing 50, and the lower part 48 of the electron gun chamber. It is this region which is most susceptible to magnetic disturbance. However, it is desirable that the shielding member 90 be provided covering the top of the electron gun chamber. As was mentioned earlier, it is important that this magnetic shielding be as continuous as possible to prevent magnetic disturbance of the electron beam, and it can be seen from FIG. 2 that the shielding is substantially continuous from the specimen chamber 12 to the electron gun chamber 43, and indeed may cover that chamber completely. The only thing which projects through the enclosure forming that shielding is the control 93 of an adjustable aperture device, which is located in the electron beam path. Since such a device is optional, the control 93 may be omitted in some cases, in which case the shielding may then be completely continuous.

According to the present invention, an evacuation path to permit evacuation of the interior of the electron column is provided within the casing 50 so that no ducting passes through the enclosure formed by the magnetic shield. This evacuation path will now be described in more detail.

Figure 3:
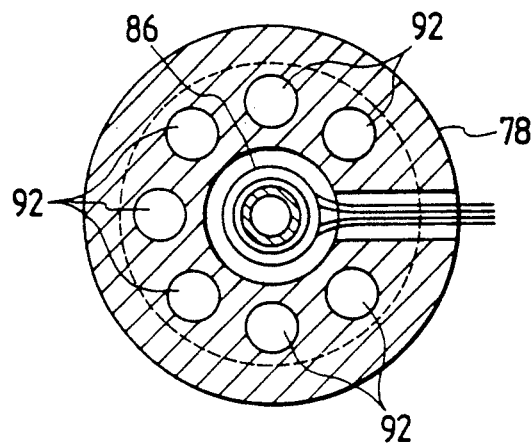
FIG. 3 shows a sectional view along the line A—A in FIG. 1.

As can be seen from FIG. 3, the tie block 78 has a plurality of bores 92 therein, thereby linking the interior of the casing 50 with the interior of the specimen chamber 12. Furthermore, the flange 70 of each lens module 56, 58, is cut, as can be seen for the lens module 56 in FIG. 5.

Figure 5:
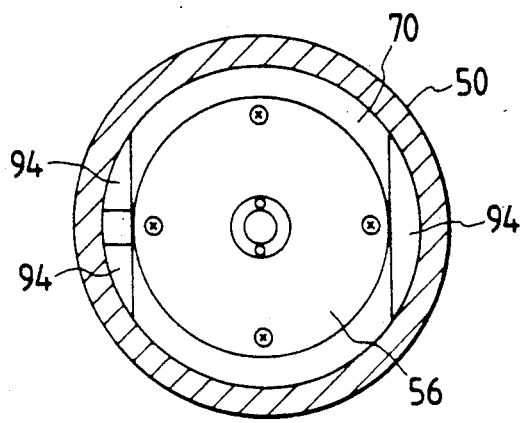
FIG. 5 shows a view in the direction of the arrow P in FIG. 2.

FIG. 5 illustrates two cut-away parts 94, but in actuality, at least one cut-away is needed. That is, it is necessary to employ a construction which makes it possible to allow the condenser lens modules 56, 58 to fit the inside of the casing 50 and to keep an evacuation space therebetween.

The cut-away parts 94 and the spacings 96, 98 between the walls of the electron lens modules 56, 58 and the internal wall of the casing 50 permit a flow path around those modules 56, 58.

Figure 4:
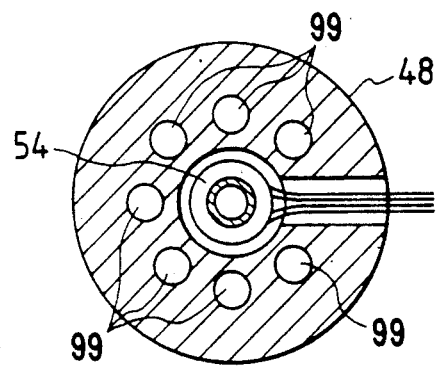
FIG. 4 shows a sectional view along the line B—B in FIG. 1.

Firstly, the spacer plate 52 and the adjacent part of the lower part 48 of the electron gun chamber are provided with through-bores 99 as shown in FIG. 4.

Thus, the evacuation path is defined from the sample chamber 12 to the interior of the electron gun chamber 42 through bores 92, cut-away parts 94, spacings 96, 98 and through-bores 99.

The conductance of the evacuation path will now be discussed. Considering first the known arrangements, assume that a pipeline extending horizontally from the electron gun chamber has an inner diameter of 28 mm and a length of 60 mm, and the pipeline connecting the above pipeline with an evacuating system has an inner diameter of 38 mm and a length of 400 mm, the conductance given to the electron gun chamber is as follows:

$$C = K \cdot d^3 / L \quad (1)$$

where K denotes the conductance coefficient given when a round pipeline is used, d denotes inner diameter, and L denotes length.

From the equation (1), the conductance $C_1$ at the 28 mm inner diameter portion is given by:

$$\begin{aligned} C_1 &= 12.1 \times 2.8^3/6 \\ &= 44.3 \ l/s \end{aligned}$$

Similarly, the conductance $C_2$ at the 38 mm inner diameter portion is given by:

$$\begin{aligned} C_2 &= 12.1 \times 3.8^3/40 \\ &= 16.6 \ l/s \end{aligned}$$

Thus, the total conductance is given by:

$$\begin{aligned} 1/C &= 1/C_1 + 1/C_2 \quad (2) \\ &= (44.3 \times 16.6)/(44.3 + 16.6) = 12 \ l/s \end{aligned}$$

Consider now the embodiment of the present invention illustrated in FIGS. 1-5. Assuming that the bores 92 of the tie block 78 described with respect to FIG. 3 have an inner diameter of 20 mm and a length of 115 mm from the above equation (1), the conductance $C_3$ given per hole is as follows:

$$\begin{aligned} C_3 &= 12.1 \times 2^3/11.5 \\ &= 8.4 \ l/s \end{aligned}$$

Thus, the total value for seven bores is 58.8 l/S. Likewise, assuming that the through-bores 99 described with respect to FIG. 4 have an inner diameter of 16 mm and a length of 40 mm, the conductance $C_4$ per through-bore is 12.4 l/S obtained by the same operation as above. Hence, the total value of seven through-bores is $C_4 = 86.8$ l/S.

If the lunate opening or cut-away part 94 defined by the casing 50 and the module 56 may be considered as a rectangle, the conductance $C_5$ at the cut-away part is as follows:

$$C_5 = K \cdot K_R \cdot a^2 \cdot b^2 / ((a+b) \cdot L) \quad (3)$$

where K denotes a conductance coefficient. $K_R$ denotes a square factor, a and b respectively denote the long side and the short side of the rectangle, and L denotes the length or depth of the cut-away part. If the rectangle has a = 40 mm, b = 12 mm, and L = 10 mm, and $K_R = 1.2$ is assumed, then, from the equation (3), the conductance $C_5$ given per rectangle is as follows:

$$C_5 = 30.9 \times 1.2 \times 4^2 \times 1.2^2/(5.2 \times 1.0) = 164 l/S$$

Thus, the conductance given by two rectangles as illustrated is 328 l/S.

In this embodiment, the conductance C of the electron gun chamber can be computed from the above equation (2), but since the conductance given by the two cut-away parts 94 is far larger than that given by the bores 92 and through-bores 99 conductance C of the electron gun chamber may be neglected when computing the conductance of this embodiment as follows:

$$\begin{aligned} 1/C &= 1/C_3 + 1/C_4 + 1/C_5 \\ &= 1/C_3 + 1/C_4 \\ &= (58.8 \times 86.8)/(58.8 + 86.8) \\ &= 37.1 \ l/s \end{aligned}$$

It can be noted from the above result that this embodiment can offer three times as much conductance as the prior art. It therefore serves to keep the electron gun chamber and the electron beam path in a high vacuum state as well as to suppress contamination in the overall system.

Furthermore, this embodiment needs no opening for a pipeline in the enclosure 18 if the electron microscope is covered by the enclosure 18 for improving the magnetic shielding. Thus more magnetic shielding and easier mounting and dismounting of the shielding cylinder may be achieved than in the prior art.

The foregoing construction makes it possible to transfer the heat generated by the coil when the condenser lenses are excited to the casing as well as to prevent the temperature of the condenser lenses from rising. It is found that the flange 70 provides sufficient heat conduction despite the openings 94. Additional openings or holes could be used, but this could limit the heat conduction. Though the embodiment shown in FIG. 1 employs two condenser lens modules 56 and 58, at least one condenser lens is necessary.

To improve magnetic shielding, it is preferable to employ a magnetic material such as pure iron, soft steel, or Permalloy for the tie block and the casing.

According to the construction described above the coils are hermetically isolated from the vacuum and a high conductance is achieved for communication between the specimen chamber 12, the interior of the casing, the electron beam path, and the electron gun chamber. It is therefore possible to suppress contamination in the path where the electron beam passes and to keep the space at high vacuum.

As will be understood from the foregoing description, this invention may thus achieve the following effects.

(1) Since an evacuating path is formed inside the electron optical cylindrical column, there is no ducting outside the column resulting in the reduction in size of the column and a high magnetic shielding effect may then be achieved.

(2) Since higher evacuating conductance improves the vacuum of the electron beam path, it becomes possible to extend the life of the filament of the electron gun and reduce contamination in the electron beam path. (3) Since there is no space provided for a ducting through the shielding cylinder, it becomes possible to further improve the magnetic shielding and more easily mount and dismount the shielding cylinder.

What is claimed is:
1. An electron microscope comprising:
a hollow sample chamber;
evacuation means communicating with the interior of the sample chamber for evacuating the sample chamber;
a casing mounted on said sample chamber;
an electron lens system provided within the casing;
an electron gun chamber mounted on the casing; and
an electron beam generating means provided in the electron gun chamber for generating an electron beam;
wherein an electron beam path is defined from the electron beam generating means to the sample chamber, and wherein the electron gun chamber, the casing, and the sample chamber define a closed space and communicate with each other so as to define an evacuation path within said closed space for enabling evacuation of said electron gun chamber by said evacuation means, said evacuation path being independent of said electron beam path.

2. An electron microscope according to claim 1, wherein the electron lens system comprises a plurality of sealed modules, each of said modules containing an electron lens and having a bore therethrough for defining part of said electron beam path.

3. An electron microscope according to claim 2, having a spacer between said modules, said spacer having an opening therein, said opening forming part of said evacuation path.

4. An electron microscope according to claim 2, wherein at least part of an outer wall of each of said modules is spaced from an inner wall of the casing, that spacing forming part of said evacuation path.

5. An electron microscope according to claim 1, further comprising a spacer between said electron gun chamber and said casing, said spacer having a plurality of through-bores provided therein, said through-bores defining part of said evacuation path.

6. An electron microscope according to claim 1, further comprising a tie member between said casing and said sample chamber, said tie member having a plurality of bores provided therein, said bores defining part of said evacuation path.

7. An electron microscope according to claim 1, further comprising magnetic shielding enclosure surrounding at least the casing.

8. An electron microscope according to claim 7, wherein said shielding enclosure is sealed to said sample chamber.

9. An electron microscope according to claim 7, wherein said shielding enclosure also surrounds said electron gun chamber.

10. An electron microscope comprising:
a hollow sample chamber;
evacuation means communicating with the interior of the sample chamber for evacuating the sample chamber;
a casting mounted on said sample chamber;
an electron lens system provided within the casing;
an electron gun chamber mounted on the casing; and
an electron beam generating means provided in the electron gun chamber for generating an electron beam;
wherein an electron beam path is defined from the electron beam generating means to the sample chamber, and wherein an evacuation path is defined within the casing so as to extend between the sample chamber and the electron gun chamber for enabling evacuation of the electron gun chamber by said evacuation means, said evacuation path being offset relative to the electron beam path.

11. An electron microscope comprising:
a hollow sample chamber;
evacuation means communicating with the interior of the sample chamber for evacuating the sample chamber;
a casing mounted on said sample chamber;
an electron lens system provided in the casing;
an electron gun chamber mounted on the casing; and
an electron beam generating means provided in the electron gun chamber for generating an electron beam;
wherein an electron beam path is defined from the electron beam generating means to the sample chamber, and wherein an evacuation path is defined within the casing for enabling evacuation of the casing via the sample chamber, said evacuation path being offset relative to the electron beam path.

12. An electron microscope comprising a hollow electron gun chamber in which an electron beam generating means for generating an electron beam is provided, a hollow casing for containing an electron lens system, a hollow sample chamber, and evacuating means for evacuating the sample chamber;
said electron microscope being characterised by the electron gun chamber, the casing, and the sample chamber defining a closed space communicating with the evacuating means, and an evacuation path being defined between the electron gun chamber, the casing, and the sample chamber, said evacuation path being different from a path of said electron beam.

13. An electron microscope comprising:
a hollow sample chamber;
a casing;
a hollow electron gun chamber; and
a plurality of sealed modules provided within the casing, each of said sealed modules containing an electron lens and having a bore therethrough for defining an electron beam path;
wherein a communication path is defined in the casing from the sample chamber to the electron gun chamber around said sealed modules, at least part of that path being defined between an outer wall of each of said sealed modules and an inner wall of said casing.

14. An electron beam column for an electron microscope, comprising;
a hollow casing;
a plurality of modules provided within said casing, each of said modules having at least one electron lens sealed therein;
a hollow electron gun chamber secured to one end of said casing; and means for delimiting at least one evacuation bore extending to the interior of the electron gun chamber;
wherein at least part of an outer wall of each of said modules is spaced from an inner wall of the casing so as to define part of an evacuation path around each of said modules, and wherein the evacuation path extends from said electron gun chamber, through said at least one evacuation bore, and around said modules, to an end of said casing remote from said electron gun chamber.

15. An electron microscope comprising:
a hollow sample chamber;
a hollow casing;
a tie member interconnecting the sample chamber and the casing, the tie member having plurality of bores provided therein;
an electron lens system provided within the casing, at least one gas flow path being provided within said casing around said electron lens system;
a hollow electron gun chamber; and
a spaced interconnecting the casing and the electron gun chamber, the spacer having a plurality of through-bores provided therein.

16. An electron microscope according to claim 15, wherein said electron lens system defines an electron beam path separate from said gas flow path.

* * * * *